(12) United States Patent
Ohuchi

(10) Patent No.: US 6,762,468 B2
(45) Date of Patent: Jul. 13, 2004

(54) SEMICONDUCTOR DEVICE AND METHOD OF MANUFACTURING THE SAME

(75) Inventor: Kazuya Ohuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/084,221

(22) Filed: Feb. 28, 2002

(65) Prior Publication Data

US 2003/0116781 A1 Jun. 26, 2003

(30) Foreign Application Priority Data

Dec. 26, 2001 (JP) ........................................ 2001-394215

(51) Int. Cl.[7] ........................ H01L 29/94; H01L 31/062; H01L 29/76
(52) U.S. Cl. ........................ 257/407; 257/336; 257/412; 257/407; 257/339
(58) Field of Search ................................ 257/19, 7, 88, 257/412, 151, 407, 516, 611, 607, 402, 20, 364, 336, 339

(56) References Cited

U.S. PATENT DOCUMENTS 5,965,926 A * 10/1999 Schwalke .................. 257/407

6,312,995 B1 * 11/2001 Yu ............................. 438/283
6,528,399 B1 *  3/2003 Alieu et al. ................. 438/561
6,545,317 B2 *  4/2003 Hokazono et al. .......... 257/336

OTHER PUBLICATIONS

T-J. King, et al., IEEE Transactions on Electron Devices, vol. 41, No. 2, pps. 228–232, "Electrical Properties of Heavily Doped Polycrystalline Silicon–Germanium Films", Feb. 1994.

* cited by examiner

Primary Examiner—Jerome Jackson
Assistant Examiner—Joseph Nguyen
(74) Attorney, Agent, or Firm—Oblon, Spivak, McClelland, Maier & Neustadt, P.C.

(57) ABSTRACT

An aspect of the present invention includes a first conductive type semiconductor region formed in a semiconductor substrate, a gate electrode formed on the first conductive type semiconductor region, a channel region formed immediately below the gate electrode in the first conductive type semiconductor region, and a second conductive type first diffusion layers constituting source/drain regions formed at opposite sides of the channel region in the first conductive type semiconductor region, the gate electrode being formed of polycrystalline silicon-germanium, in which the germanium concentration of at least one of the source side and the drain side is higher than that of the central portion.

6 Claims, 7 Drawing Sheets

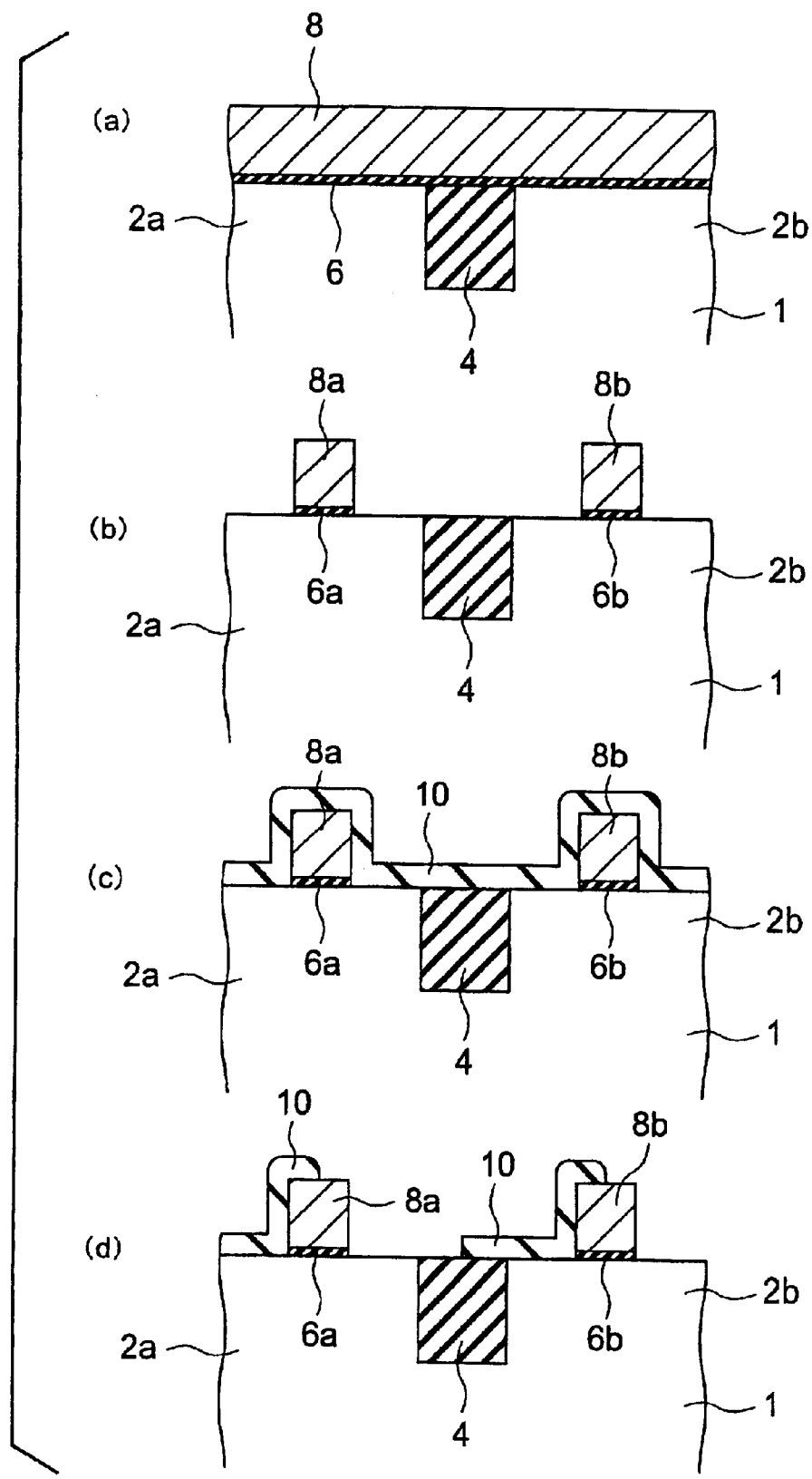
F I G. 2

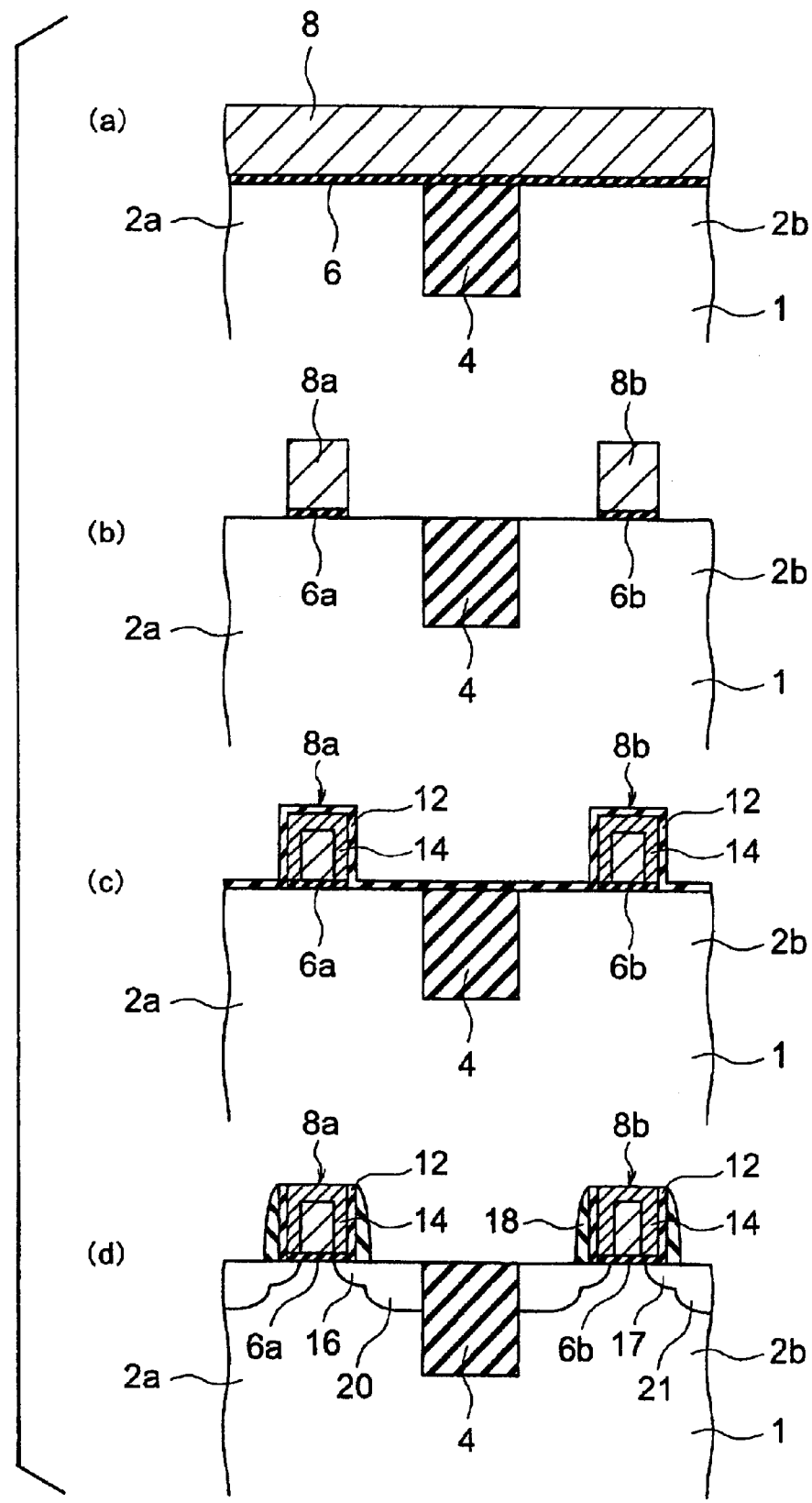
F I G. 7

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2001-394215, filed on Dec. 26, 2001; the entire contents of which are incorporated herein by reference.

BACKGROUND OF THE INVENTION

1. Field of the Invention

The present invention relates to a semiconductor device including a metal-insulator-semiconductor filed effect transistor (MISFET) and a method of manufacturing the same.

2. Related Background Art

It is known that in a MISFET or MOSFET, a hot carrier is generated as a result of electric field concentration at a gate edge, thereby to degrade the reliability of gate breakdown voltage. In order to prevent this, side portions of the gate are oxidized to thicken an insulating layer at the gate edge obtained by oxidizing the gate side portion, i.e., a reoxidized layer, to moderate the electric field intensity near the gate edge. However, a sufficient thickness of the reoxidized layer is required to appropriately moderate electric field. If a reoxidized layer 12 with a sufficient thickness is formed as shown in FIG. 8, this oxidized layer 12 may hinder subsequently-performed very-low-acceleration ion implantation or impurity doping using plasma, using gate electrodes 8a and 8b as masks, for forming an n-type extension layer 16 and a p-type extension layer 17 having a lower impurity concentration than n-type source/drain regions 20 and p-type source/drain regions 21. In FIG. 8, the reference numeral 1 denotes an n-type semiconductor substrate, 2a denotes a p-type semiconductor region, 2b denotes an n-type semiconductor region, 4 denotes a device isolating insulating layer, and 6a and 6b denote gate insulating layers.

Generally, polycrystalline silicon-germanium is used as a material of a gate electrode to activate an impurity (e.g., boron). When the reoxidized layer 12 with a sufficient thickness is formed as shown in FIG. 8, the edges of the gate electrodes 8a and 8b have a higher resistance value than the central portion 34 since deactivation of the impurity doped to make polycrystalline silicon-germanium conductive occurs at the side portions of the gate electrodes 8a and 8b. In a gate electrode which is particularly miniaturized, the proportion of the above-described deactivated portion in the gate electrode increases, thereby to form a depletion layer in the gate electrode. Accordingly, the capability of driving current of transistor is reduced, and the performance of MISFET is degraded.

SUMMARY OF THE INVENTION

A semiconductor device according to a first aspect of the present invention includes: a first conductive type semiconductor region formed in a semiconductor substrate; a gate electrode formed on the first conductive type semiconductor region; a channel region formed immediately below the gate electrode in the first conductive type semiconductor region; and a second conductive type first diffusion layer constituting source/drain regions formed at opposite sides of the channel region in the first conductive type semiconductor region, the gate electrode being formed of polycrystalline silicon-germanium, in which germanium concentration of at least one of a source side and a drain side is higher than that of a central portion.

A semiconductor device according to a second aspect of the present invention includes: a first conductive type semiconductor region formed in a semiconductor substrate; a gate electrode of polycrystalline silicon-germanium formed on the first conductive type semiconductor region; a channel region formed immediately below the gate electrode in the first conductive type semiconductor region; a second conductive type first diffusion layer constituting source/drain regions formed at opposite sides of the channel region in the first conductive type semiconductor region; and an oxide layer formed on at least one of a source region side and a drain region side of said gate electrode, a germanium concentration in a region with a thickness substantially identical to the thickness of said oxide layer, ranging from the side of the gate electrode where said oxide layer is formed, is 1.5 to 2 times the germanium concentration of a central portion of the gate electrode.

A semiconductor device according to a third aspect of the present invention includes: a first MISFET having: a first conductive type first semiconductor region formed in a semiconductor substrate; a first gate electrode formed on the first semiconductor region; a first channel region formed immediately below the first gate electrode in the first semiconductor region; and a second conductive type first diffusion layer constituting source/drain regions formed at opposite sides of the first channel region in the first conductive type semiconductor region; and a second MISFET having: a second conductive type second semiconductor region formed in the semiconductor substrate and isolated from the first semiconductor region; a second gate electrode formed on the second semiconductor region; a second channel region formed immediately below the second gate electrode in the second semiconductor region; and a first conductive type second diffusion layer constituting source/drain regions formed at opposite sides of the second channel region in said second conductive type semiconductor region, the first and second gate electrodes being formed of polycrystalline silicon-germanium, in which germanium concentration of at least one of a source side and a drain side is higher than a central portion.

A method of manufacturing a semiconductor device according to a fourth aspect of the present invention includes: forming a gate electrode containing polycrystalline silicon-germanium on a first conductive type semiconductor region in a semiconductor substrate; selectively forming a first insulating layer on said gate electrode such that a portion near one side of said gate electrode is exposed; and forming an oxide layer by selectively oxidizing silicon near the exposed side of said gate electrode.

A method of manufacturing a semiconductor device according to a fifth aspect of the present invention includes: forming a gate electrode containing polycrystalline silicon-germanium on a first conductive type semiconductor region in a semiconductor substrate; and forming an oxide layer all over the gate electrode by selectively oxidizing silicon in the gate electrode.

BRIEF DESCRIPTION OF THE DRAWINGS

FIGS. 2(a) to 2(d) are sectional views showing manufacturing process of a method of manufacturing a semiconductor device according to a second embodiment of the present invention.

FIGS. 7(a) to 7(d) are sectional views showing manufacturing process of a method of manufacturing a semiconductor device according to a fourth embodiment of the present invention.

DESCRIPTION OF THE EMBODIMENTS

Hereinafter, embodiments of the present invention will be described with reference to the accompanying drawings.

(First Embodiment)

Figure 1:
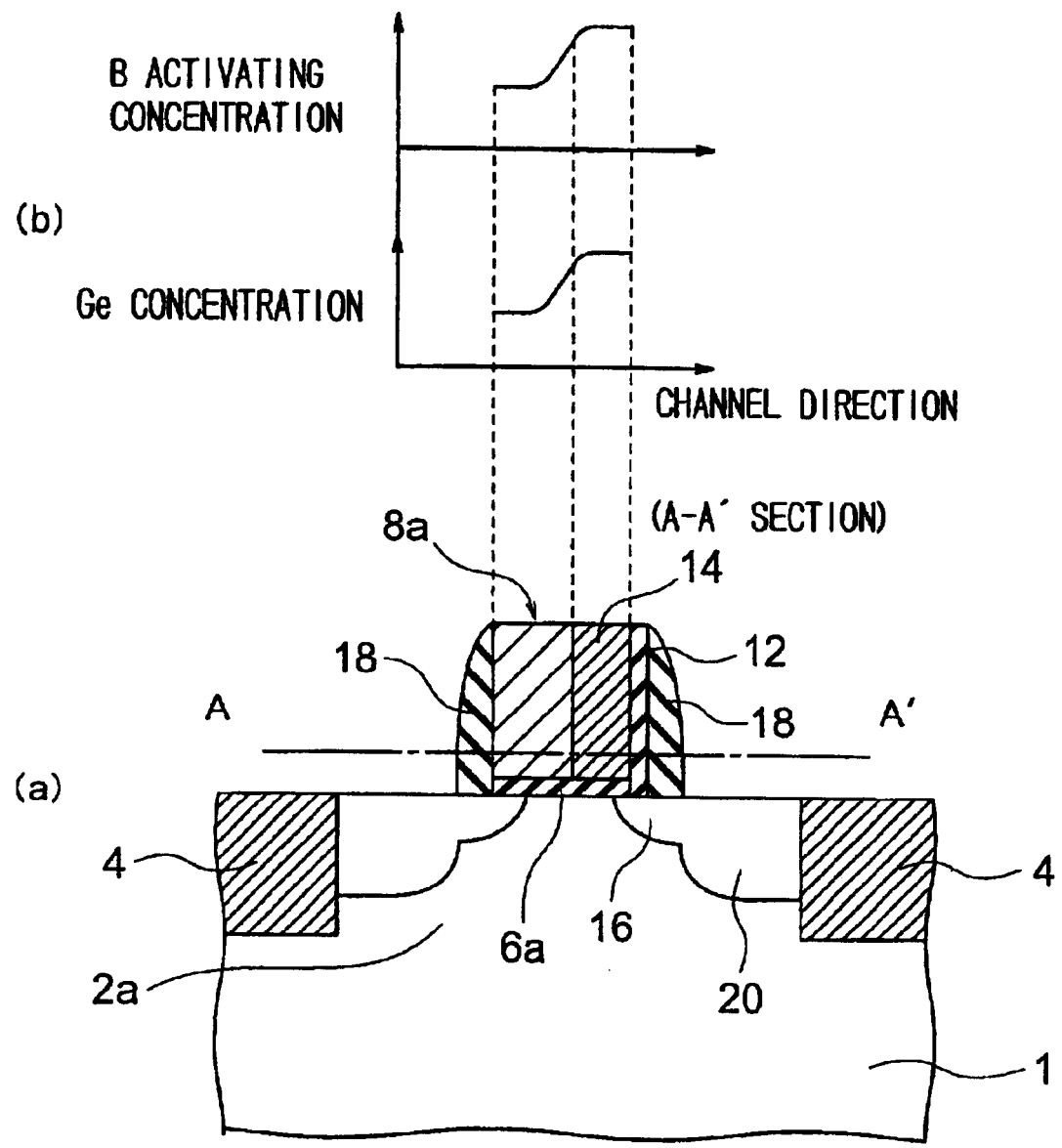
FIGS. 1(a) and 1(b) show the structure of a semiconductor device according to a first embodiment of the present invention.

A semiconductor device according to a first embodiment of the present invention will be described with reference to FIGS. 1(a) to 1(b). The semiconductor device of this embodiment includes a MISFET having a gate electrode of polycrystalline silicon-germanium. FIG. 1(a) shows the structure thereof, and FIG. 1(b) shows the concentration distribution graph of boron (B) and germanium (Ge) at the section taken along line A–A' of FIG. 1(a).

The semiconductor device in this embodiment includes an n-channel MISFET having a gate electrode 8a formed in a p-type semiconductor region 2a of a semiconductor substrate 1, which gate electrode 8a is isolated by a device isolation insulating layer 4, a channel region formed immediately below the gate electrode 8a in the p-type semiconductor region 2a, an n-type diffusion layer 20 constituting source/drain regions formed at the opposite sides of the channel region in the p-type semiconductor region 2a, an n-type diffusion layer (hereinafter also referred to as "extension layer") 16 formed between the diffusion layer 20 and the channel region in the p-type semiconductor region 2a and having an impurity concentration lower than the diffusion layer 20, and a gate sidewall 18 of an insulating material formed at the side portion of the gate electrode 8a. Furthermore, in this MISFET, the gate electrode 8a is formed of polycrystalline silicon-germanium, and boron (B) is implanted thereto to make it conductive. As shown in FIG. 1(b), the germanium concentration of the gate electrode 8a is continuously increased from the drain side to the source side. That is, in the gate electrode 8a, a portion 14 having a higher activating concentration of boron and a higher concentration of germanium is formed at the source side, and a portion having lower concentrations is formed at the drain side. As germanium activates p-type impurities (such as boron), the activating concentration of boron is continuously increased from the drain side to the source side. An oxide layer 12 is formed between the portion 14 having a higher germanium concentration and the gate sidewall 18. The thickness of the portion 14 having a higher germanium concentration is substantially the same as that of the oxide layer 12. The germanium concentration of that portion is 1.5 to 2 times that of the central portion of the gate electrode 8a.

A source electrode and a drain electrode are formed on the source/drain regions 20, which are not shown in the drawings.

As described above, in this embodiment, since the germanium concentration at the drain side is lower than that of the source side, the impurity (boron) activating concentration of the drain side is lower than that of the source side. Accordingly, in the region near the drain region, to which a high electric field is applied, since a depletion layer expands in the gate electrode 8a, depletion layer capacitance is connected in series to the capacitance between the gate electrode 8a and the drain electrode (not shown). Accordingly, the gate capacitance is effectively decreased to moderate the electric field at the drain edge, thereby inhibiting the degradation of the gate breakdown voltage at the drain edge. Accordingly, even if miniaturization of devices is carried out, it is possible to inhibit the degradation of performance.

(Second Embodiment)

Next, a method of manufacturing a semiconductor device according to a second embodiment of the present invention will be described with reference to FIGS. 2(a) to 2(d) and 3(a) to 3(b).

First, as shown in FIG. 2(a), a device isolation insulating layer 4 of an insulating material is formed in an n-type semiconductor substrate 1, and a p-type semiconductor region 2a is formed in one of the isolated regions by implanting a p-type impurity therein. Accordingly, the other of the isolated regions becomes an n-type semiconductor region 2b. Subsequently, a gate insulating layer 6 is formed over the p-type semiconductor region 2a and the n-type semiconductor region 2b, and a polycrystalline silicon-germanium layer 8 is deposited thereon by CVD (Chemical Vapor Deposition) method.

Then, as shown in FIG. 2(b), the polycrystalline silicon-germanium layer 8 is patterned by the lithography technique and RIE (Reactive Ion Etching) method to form gate electrodes 6a and 6b on the semiconductor regions 2a and 2b.

Figure 3:
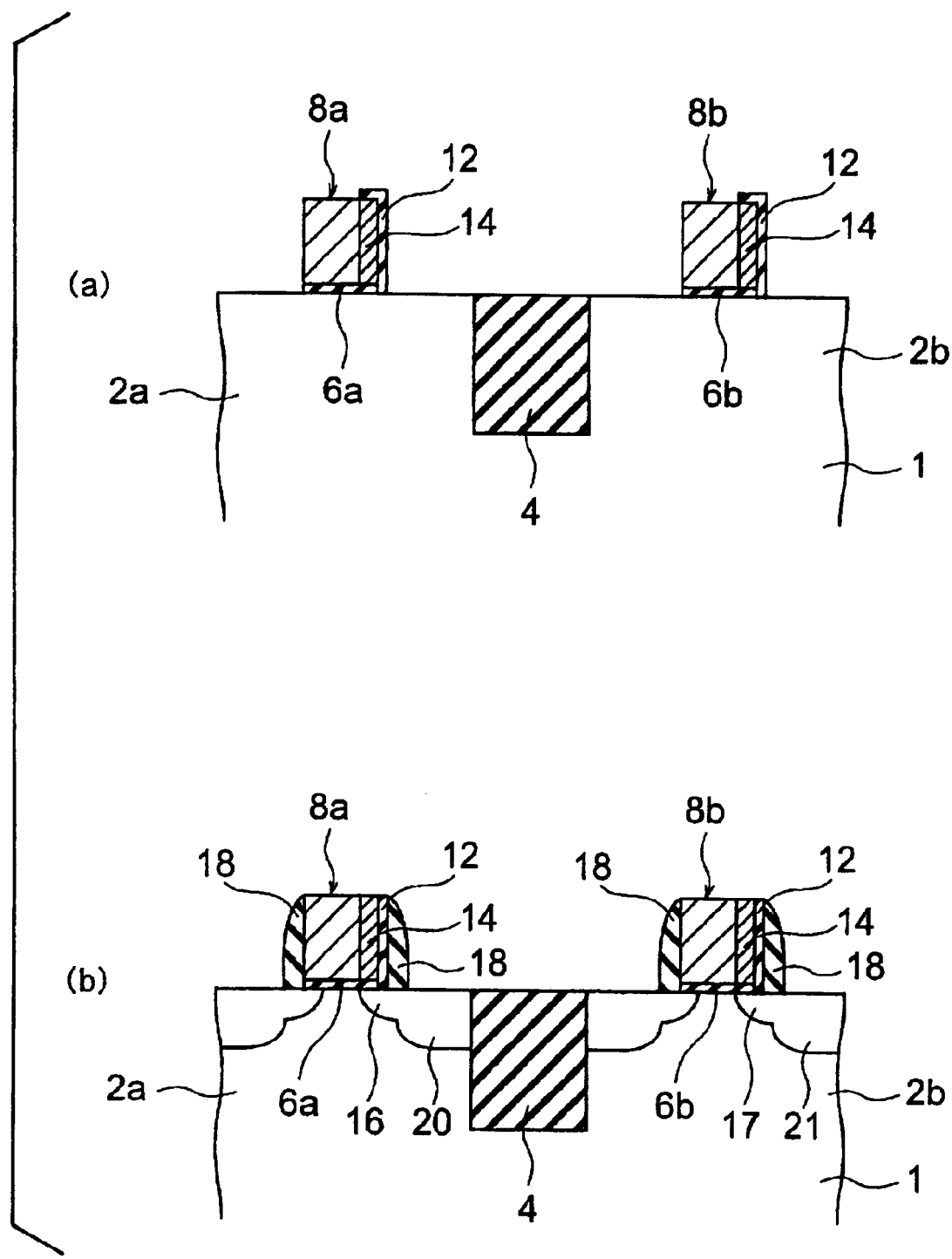
FIGS. 3(a) to 3(b) are sectional views showing manufacturing process of the method of manufacturing a semiconductor device according to the second embodiment of the present invention.

Next, as shown in FIG. 2(c), an oxidation preventing layer 10 of a material preventing the entry of oxidizer, e.g., silicon nitride, is deposited over the entire surface. Then, as shown in FIG. 2(d), the oxidation preventing layer 10 is pattered by the lithography technique to expose only one side (source side) of each electrode 8a, 8b. Then, as shown in FIG. 3(a), each of the exposed sides of the gate electrodes 8a and 8b is oxidized to form an oxide layer 12. Thereafter, the oxidation preventing layer 10 is removed. By setting the oxidation condition such that silicon in polycrystalline silicon-germanium is selectively oxidized, the germanium concentration is increased only in portions 14 of the gate electrodes 8a and 8b covered by the oxide layer 12. The thickness of the oxide layer 12 is set to be 0.5 nm or more, and 10 nm or less. The upper limit of the thickness of the oxide layer 12 is set such that ion implantation for forming source/drain extension layers 16 and 17 is not hindered. The lower limit is determined by considering the region at the gate edge portion where germanium concentration is increased, and the concentration thereof. In the MISFET thus obtained, if the germanium concentration at the time of deposition is 20%, the germanium concentration in the gate electrode with the oxide layer having a thickness of 2 nm at its source edge is 20% at its drain edge portion, and 40% at its source edge portion extending about 2 nm from the edge.

Next, ion-implantation of an impurity is performed to form the extension layers 16 and 17, as shown in FIG. 3(b). First, the extension layer 16 is formed by covering the p-channel MISFET forming region, i.e., the n-type semiconductor region 2b with a photo resist pattern, and by implanting an n-type impurity into the n-channel MISFET forming region, i.e., the p-type semiconductor region 2a using the gate electrode 8a as a mask. Subsequently, after the resist pattern is removed, the extension layer 17 is formed by covering the n-channel MISFET forming region 2a with a photo resist pattern, and by implanting a p-type impurity into the p-channel MISFET forming region 2b using the gate electrode 8b as a mask. Thereafter, the resist pattern is removed. Although the extension layer 17 was formed after the formation of the extension layer 16 in the above description, the extension layer 17 may be formed before the formation of the extension layer 16.

Next, a gate sidewall 18 is formed by depositing an insulating material all over the surface, and etching the insulating material by RIE method such that the insulating material remains on the side portions of the gate electrodes 8a and 8b. Thereafter, an n-type diffusion layer 20 and a p-type diffusion layer 21 serving as source/drain regions are formed. The n-type diffusion layer 20 is formed by performing ion implantation of an n-type impurity, e.g., arsenic ($As^+$) or phosphorus ($P^+$) into the n-channel MISFET forming region 2a using the gate electrode 8a as a mask after the formation of a photo resist pattern (not shown) covering the p-channel MISFET forming region 2b. After the above resist patter is removed, the p-type diffusion layer 21 is formed by performing ion implantation of a p-type impurity, e.g., boron ($B^+$), into the p-channel MISFET forming region 2b using the gate electrode 8b as a mask after the formation of a photo resist pattern (not shown) covering the n-channel MISFET forming region 2a. That is, the diffusion layer 20 is formed in a self-aligned manner with respect to the gate electrode 8a and the gate sidewall 18, and the diffusion layer 21 is formed in a self-aligned manner with respect to the gate electrode 8b and the gate sidewall 18. Although the diffusion layer 21 was formed after the formation of the diffusion layer 20 in the above description, the diffusion layer 21 may be formed before the formation of the diffusion layer 20.

Next, known anneal treatment with a fact thermal processing rate is performed to activate the diffusion layers 20 and 21 serving as source/drain regions. Thereafter, a salicide step to perform silicidation of only the portions where silicon is exposed is performed by depositing nickel, titan, or titanium nitride, performing anneal treatment, and removing unreacted metal layer by chemical treatment. Then, an insulating layer (not shown) is deposited, which is smoothed by CMP (Chemical Mechanical Polishing). Subsequently, a contact hole is formed through the insulating layer to the source/drain regions 20 and 21. Then, a metal is filled in the contact hole to form source/drain electrodes (not shown), thereby completing the MISFET.

In the MISFET manufactured by the method of this embodiment, the germanium concentration at the drain side is lower than that at the source side. Accordingly, the impurity activating concentration at the drain side is lowered. Therefore, in a portion near the drain, where a high electrical field is applied, a depletion layer extends in the gate electrode. Consequently, a depletion capacitance is connected in series with the capacitance between the gate electrode and the drain electrode. Thus, since the gate capacitance is effectively lowered to moderate the electrical field at the drain edge, it is possible to prevent the reduction in the gate breakdown voltage at the drain edge. If this embodiment is applied to the manufacture of a MISFET of 40 nm or less in channel length with an oxide layer at the source edge at 0.5 nm or more and 10 nm or less in thickness, it is possible to achieve a profile of which the germanium concentration is lowered from the source edge to the drain edge. Thus, it is possible to inhibit the degradation of performance even if miniaturization of devices is carried out.

Figure 4:
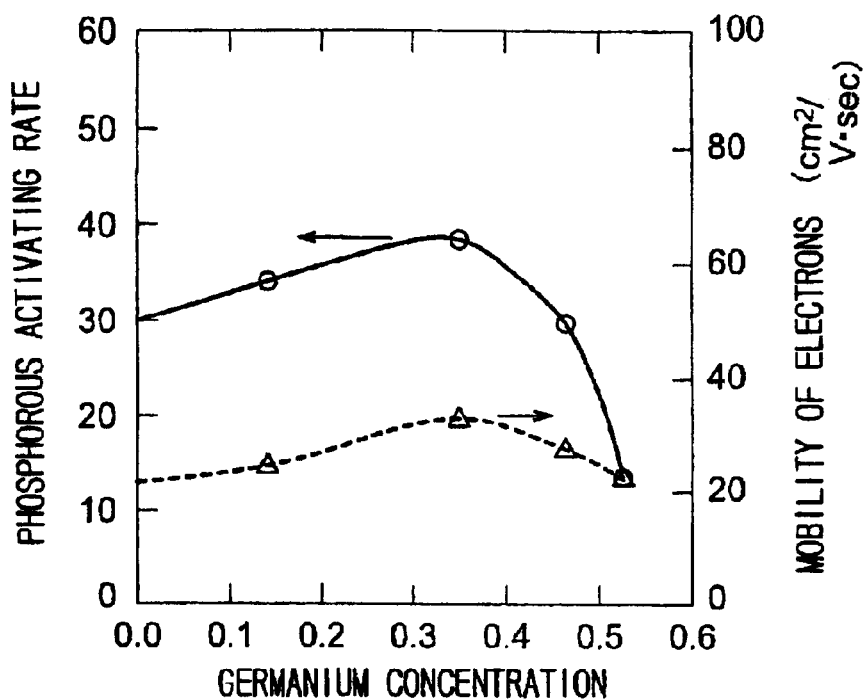
FIG. 4 is a graph showing the germanium concentration dependence of phosphorous activating rate.
Figure 5:
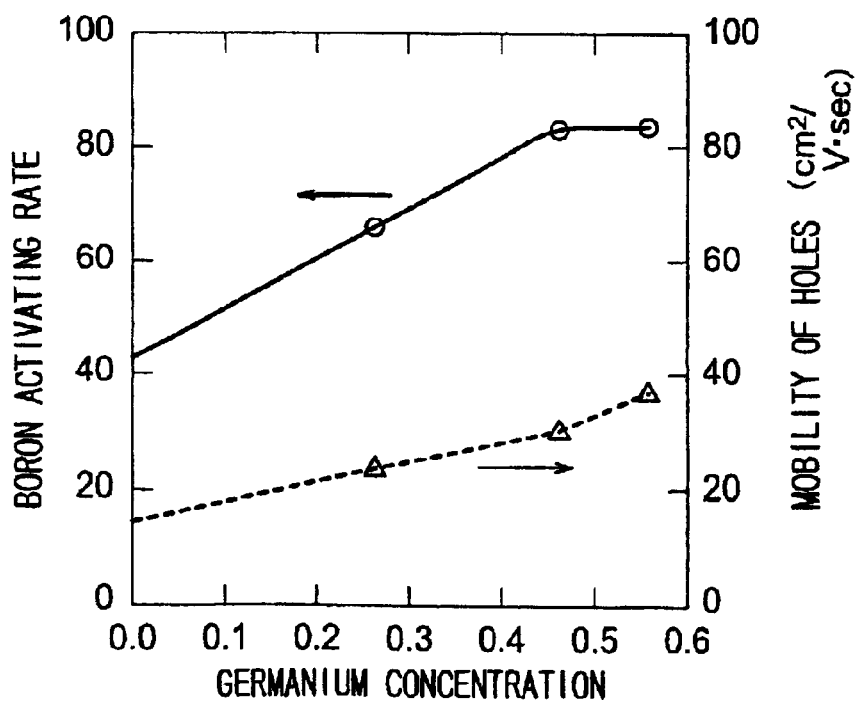
FIG. 5 is a graph showing the germanium concentration dependence of boron activating rate.

FIGS. 4 and 5 show graphs of germanium concentration dependence of phosphorous/boron activating rates, by T. J. King, in IEEE Transaction Electron Devices, vol. 41, No. 2, p228, 1994. As can be understood from the graphs, the phosphorous/boron activating rates rise with an increase in germanium concentration of up to about 40%. Accordingly, in the manufacturing method of this embodiment, the same advantageous effects can be obtained for the n-channel MISFET and the p-channel MISFET. In FIG. 4, the solid line indicates the germanium concentration dependence of phosphorous activating rate, and the broken line shows the germanium concentration dependence of electron mobility. In FIG. 5, the solid line indicates the germanium concentration dependence of boron activating rate, and the broken line shows the germanium concentration dependence of hole mobility.

(Third Embodiment)

Figure 6:
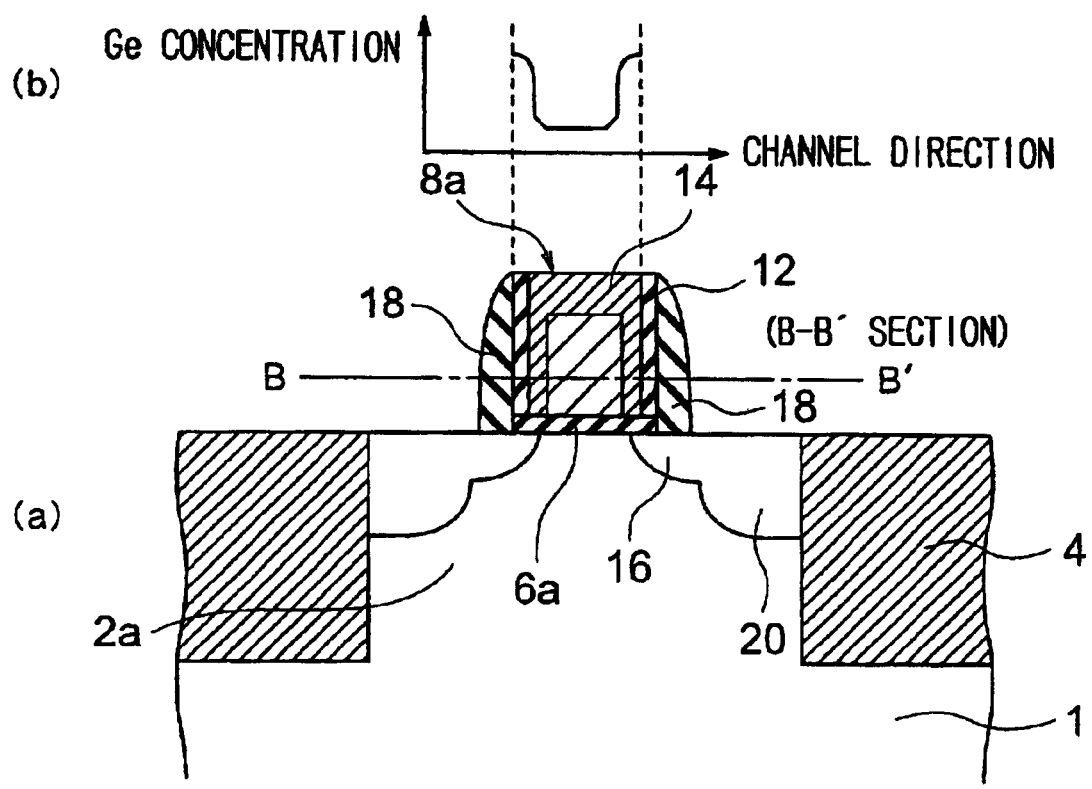
FIGS. 6(a) and 6(b) show the structure of a semiconductor device according to a third embodiment of the present invention.
Figure 8:
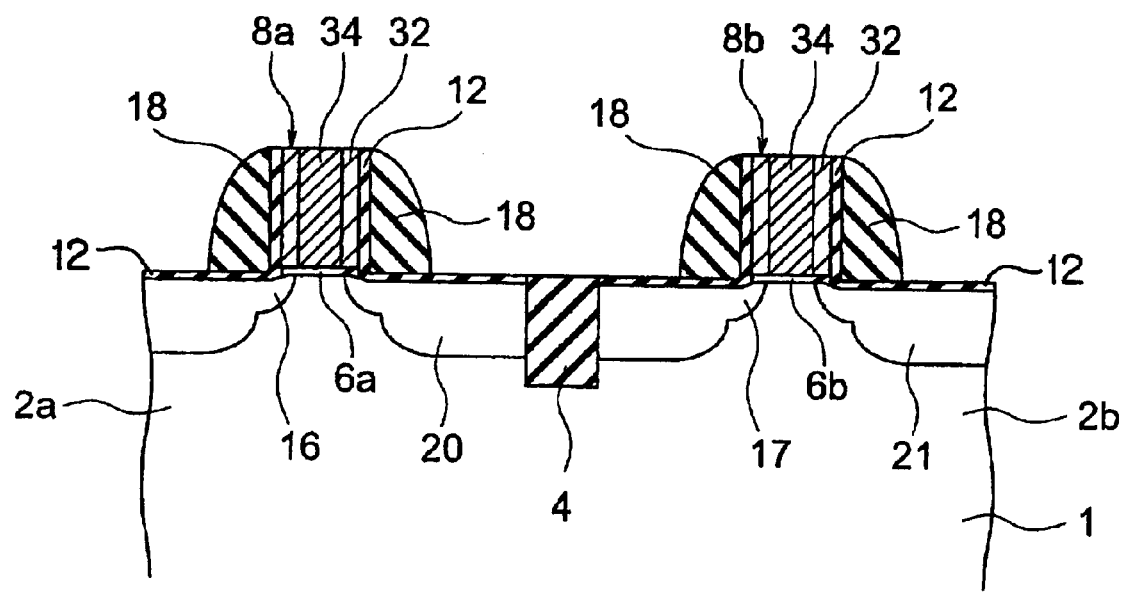
FIG. 8 is a sectional view showing the structure of a conventional semiconductor device.

FIGS. 6(a) and 6(b) show the structure of a semiconductor device according to a third embodiment of the present invention. The semiconductor device in this embodiment includes a MISFET having a gate electrode of polycrystalline silicon-germanium. FIG. 6(a) shows the structure of the MISFET, and FIG. 6(b) shows a graph of germanium (Ge) concentration distribution at the section taken along line B–B' in FIG. 6(a).

The semiconductor device in this embodiment includes an n-channel MISFET having a gate electrode 8a formed in a p-type semiconductor region 2a of a semiconductor substrate 1, which gate electrode 8a is isolated by a device isolation insulating layer 4, a channel region formed immediately below the gate electrode 8a in the p-type semiconductor region 2a, an n-type diffusion layer 20 constituting source/drain regions formed in the p-type semiconductor region 2a, an n-type diffusion layer (hereinafter also referred to as "extension layer") 16 formed between the diffusion layer 20 and the channel region in the p-type semiconductor region 2a and having an impurity concentration lower than the diffusion layer 20, and a gate sidewall 18 of an insulating material formed at the side portion of the gate electrode 8a. Furthermore, in this MISFET, the gate electrode 8a is formed of polycrystalline silicon-germanium, and boron (B) is implanted thereto to make it conductive. As shown in FIG. 6(b), the germanium concentration of the gate electrode 8a is continuously decreased from the source/drain sides to the central portion of the channel region. That is, in the gate electrode 8a, a portion 14 having a higher germanium concentration is formed at the source/drain sides and the upper portion, and a portion having a lower germanium concentration is formed at the central portion. Accordingly, the activating concentration of boron is continuously decreased from the source/drain sides to the central portion in the channel region. An oxide layer 12 is formed between the portion 14 having a higher germanium concentration and the gate sidewall 18. The thickness of the portion 14 having a higher germanium concentration is substantially the same as that of the oxide layer 12. The germanium concentration in the portion 14 is 1.5 to 2 times that of the central portion of the gate electrode 8a.

A source electrode and a drain electrode are formed on the source/drain regions 20, which are not shown in the drawings.

As described above, in this embodiment, each of the gate electrodes 8a and 8b has the structure that the germanium concentration at the source/drain sides is higher than that of the central portion. Accordingly, the impurity (boron) activating concentration of the source/drain sides is higher than that of the central portion, and the resistance of the source/ drain sides is lower than that of the central portion. Therefore, even if the miniaturization of the device is carried out, the proportion of the inactive region (high resistance region) in the gate electrode is not increased. Accordingly, it is possible to inhibit the formation of depletion layer in the gate electrode, thereby preventing the decrease in the capability of driving current of transistors. Thus, it is possible to inhibit the degradation of performance even if miniaturization of devices is carried out.

(Fourth Embodiment)

Next, a method of manufacturing a semiconductor device according to a fourth embodiment of the present invention will be described with reference to FIGS. 7(a) to 7(d) showing sectional views of the process of manufacturing a MISFET formed in accordance with the method of this embodiment.

First, as shown in FIG. 7(a), a device isolation insulating layer 4 of an insulating material is formed in an n-type semiconductor substrate 1, and a p-type semiconductor region 2a is formed in one of the isolated regions by implanting a p-type impurity therein. Accordingly, the other of the isolated regions becomes an n-type semiconductor region 2b. Subsequently, a gate insulating layer 6 is formed over the p-type semiconductor region 2a and the n-type semiconductor region 2b, and a polycrystalline silicon-germanium layer 8 is deposited thereon by thermal CVD method.

Then, as shown in FIG. 7(b), the polycrystalline silicon-germanium layer 8 is patterned by the lithography technique and RIE (Reactive Ion Etching) method to form gate electrodes 6a and 6b on the semiconductor regions 2a and 2b.

Subsequently, an oxide layer 12 is formed by selectively oxidizing the exposed surfaces of the gate electrodes 8a and 8b, as shown in FIG. 7(c). By setting the oxidation condition such that silicon in polycrystalline silicon-germanium is selectively oxidized, the germanium concentration is increased only in portions 14 of the gate electrodes 8a and 8b covered by the oxide layer 12 formed near both the sides and upper portions of the gate electrodes 8a and 8b.

Next, ion-implantation of an impurity to form extension layers 16 and 17 is performed, as shown in FIG. 7(d). First, the extension layer 16 is formed by covering the p-channel MISFET forming region, i.e., the n-type semiconductor region 2b with a photo resist pattern, and by implanting an n-type impurity into the n-channel MISFET forming region, i.e., the p-type semiconductor region 2a using the gate electrode 8a as a mask. Subsequently, after the resist pattern is removed, the extension layer 17 is formed by covering the n-channel MISFET forming region 2a with a photo resist pattern, and by implanting a p-type impurity into the p-channel MISFET forming region 2b using the gate electrode 8b as a mask. Thereafter, the resist pattern is removed. Although the extension layer 17 was formed after the formation of the extension layer 16 in the above description, the extension layer 17 may be formed before the formation of the extension layer 16.

Next, a gate sidewall 18 is formed by depositing an insulating material all over the surface, and etching the insulating material by RIE method such that the insulating material remains on the side portions of the gate electrodes 8a and 8b. The oxide layer 12 on the gate electrodes 8a and 8b is removed in the above etching step. Thereafter, an n-type diffusion layer 20 and a p-type diffusion layer 21 serving as source/drain regions are formed. The n-type diffusion layer 20 is formed by performing ion implantation of an n-type impurity, e.g., arsenic ($As^+$) or phosphorus ($P^+$) into the n-channel MISFET forming region 2a using the gate electrode 8a as a mask after the formation of a photo resist pattern (not shown) covering the p-channel MISFET forming region 2b. After the above resist patter is removed, the the p-type diffusion layer 21 is formed by performing ion implantation of a p-type impurity, e.g., boron ($B^+$), into the p-channel MISFET forming region 2b using the gate electrode 8b as a mask after the formation of a photo resist pattern (not shown) covering the n-channel MISFET forming region 2a. That is, the diffusion layer 20 is formed in a self-aligned manner with respect to the gate electrode 8a and the gate sidewall 18, and the diffusion layer 21 is formed in a self-aligned manner with respect to the gate electrode 8b and the gate sidewall 18. Although the diffusion layer 21 was formed after the formation of the diffusion layer 20 in the above description, the diffusion layer 21 may be formed before the formation of the diffusion layer 20.

Next, known anneal treatment with a fast thermal processing rate is performed to activate the diffusion layers 20 and 21 serving as source/drain regions. Thereafter, a salicide step to perform silicidation of only the portions where silicon is exposed is executed by depositing nickel, titan, or titanium nitride, performing anneal treatment, and removing unreacted metal layer by chemical treatment. Then, an insulating layer (not shown) is deposited, which is smoothed by CMP (Chemical Mechanical Polishing). Subsequently, a contact hole is formed through the insulating layer to the source/drain regions 20 and 21. Then, a metal is filled in the contact hole to form source/drain electrode (not shown), thereby completing the MISFET.

As described above, in this embodiment, each of the gate electrodes 8a and 8b has the structure that the germanium concentration at the source/drain sides is higher than that of the central portion. Accordingly, the impurity (boron) activating concentration of the source/drain sides is higher than that of the central portion, and the resistance of the source/drain sides is lower than that of the central portion. Therefore, even if the miniaturization of the device is carried out, the proportion of the inactive region (high resistance region) in the gate electrode is not increased. Accordingly, it is possible to inhibit the formation of depletion layer in the gate electrode, thereby preventing the decrease in the capability of driving current of transistors. Thus, it is possible to inhibit the degradation of performance even if miniaturization of devices is carried out.

As described above, according to the present invention, it is possible to inhibit the degradation of performance even if miniaturization of devices is carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
    a first conductive type semiconductor region formed in a semiconductor substrate;
    a gate electrode formed on said first conductive type semiconductor region;
    a channel region formed immediately below said gate electrode in said first conductive type semiconductor region; and
    a second conductive type first diffusion layer constituting source/drain regions formed at opposite sides of said channel region in said first conductive type semiconductor region, said gate electrode being formed of polycrystalline silicon-germanium, in which germanium concentration is continuously increased from a drain side to a source side.

2. The semiconductor device according to claim 1, further comprising a second conductive type second diffusion layer formed between said first diffusion layer and said channel region in said first conductive type semiconductor region and having a lower impurity concentration and a shallower depth than said first diffusion layer.

3. The semiconductor device according to claim 1, further comprising a gate sidewall of an insulating material formed at a side portion of said gate electrode, wherein an oxide layer is formed between said gate sidewall and an edge of said gate electrode having a higher germanium concentration.

4. A semiconductor device comprising:
a first conductive type semiconductor region formed in a semiconductor substrate;
a gate electrode of polycrystalline silicon-germanium formed on said first conductive type semiconductor region;
a channel region formed immediately below said gate electrode in said first conductive type semiconductor region;
a second conductive type first diffusion layer constituting source/drain regions formed at opposite sides of said channel region in said first conductive type semiconductor region; and
an oxide layer formed on a source region side of said gate electrode,
a germanium concentration in a region with a thickness substantially identical to the thickness of said oxide layer, ranging from the side of said gate electrode where said oxide layer is formed, is 1.5 to 2 times the germanium concentration of a central portion of said gate electrode and the germanium concentration of said gate electrode being continuously decreased from the source side to a drain side.

5. The semiconductor device according to claim 4, further comprising a second conductive type second diffusion layer formed between said first diffusion layer and said channel region in said first conductive type semiconductor region and having a lower impurity concentration and a shallower depth than said first diffusion layer.

6. A semiconductor device comprising:
a first MISFET including:
  a first conductive type first semiconductor region formed in a semiconductor substrate;
  a first gate electrode formed on said first semiconductor region;
  a first channel region formed immediately below said first gate electrode in said first semiconductor region; and
  a second conductive type first diffusion layer constituting source/drain regions formed at opposite sides of said first channel region in said first conductive type semiconductor region; and
a second MISFET including:
  a second conductive type second semiconductor region formed in the semiconductor substrate and isolated from said first semiconductor region;
  a second gate electrode formed on said second semiconductor region;
  a second channel region formed immediately below said second gate electrode in said second semiconductor region; and
  a first conductive type second diffusion layer constituting source/drain regions formed at opposite sides of said second channel region in said second conductive type semiconductor region,
said first and second gate electrodes being formed of polycrystalline silicon-germanium, in which germanium concentration is continuously increased from the drain side to the source side.

* * * * *